US011335723B2

(12) United States Patent
Tanaka

(10) Patent No.: US 11,335,723 B2
(45) Date of Patent: May 17, 2022

(54) IMAGE PICKUP ELEMENT AND IMAGE PICKUP APPARATUS

(71) Applicant: CANON KABUSHIKI KAISHA, Tokyo (JP)

(72) Inventor: Masanori Tanaka, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 155 days.

(21) Appl. No.: 16/716,717

(22) Filed: Dec. 17, 2019

(65) Prior Publication Data
US 2020/0243594 A1 Jul. 30, 2020

(30) Foreign Application Priority Data

Jan. 29, 2019 (JP) .............................. JP2019-012781

(51) Int. Cl.
H01L 27/14 (2006.01)
H01L 31/02 (2006.01)
H01L 27/146 (2006.01)
H01L 31/107 (2006.01)

(52) U.S. Cl.
CPC .. H01L 27/14643 (2013.01); H01L 27/14621 (2013.01); H01L 31/02027 (2013.01); H01L 31/107 (2013.01)

(58) Field of Classification Search
CPC ......... H01L 27/14643; H01L 27/14621; H01L 31/02027; H01L 31/107
USPC .............................. 257/438; 438/48, 91, 380
See application file for complete search history.

(56) References Cited

U.S. PATENT DOCUMENTS

2010/0148040 A1* 6/2010 Sanfilippo ........... H01L 31/1075
250/214.1
2017/0033253 A1* 2/2017 Huntington ......... H01L 31/1075
2017/0131143 A1* 5/2017 Andreou ........... H01L 31/02027

FOREIGN PATENT DOCUMENTS

JP 2010-091378 A 4/2010

* cited by examiner

Primary Examiner — Didarul A Mazumder
(74) Attorney, Agent, or Firm — Venable LLP

(57) ABSTRACT

An image pickup element using an APD is provided. The image pickup element has a first substrate, a second substrate, and a connector. The first substrate is provided with a plurality of light receivers having the APD. The second substrate has a pixel circuit that corresponds to each of the APDs. Additionally, the connector electrically connects the APD and the pixel circuit corresponding to the APD.

9 Claims, 5 Drawing Sheets

IMAGE PICKUP ELEMENT AND IMAGE PICKUP APPARATUS

BACKGROUND OF THE INVENTION

Field of the Invention

The present invention relates to an image pickup element and an image pickup apparatus.

Description of the Related Art

As an image pickup element used in an image pickup apparatus such as a camera or a video, an image pickup element that converts photons incident to a photodiode (PD) into electric charges, accumulates the converted charges, and outputs an amount of the electric charges to serve as an analog amount has been proposed. When the photons are incident to the PD, the PD generates electric charges substantially linearly in accordance with the number of incident photons, and accumulates the electric charges. The electric charges accumulated in the PD are transferred to a floating diffusion (FD) and converted into a voltage. The voltage converted by the FD is amplified by a source follower and input to an A/D conversion circuit located around a pixel array in the form of analog signals.

In recent years, an image pickup element that uses an avalanche photodiode (APD) has been studied. When photons are incident to the APD in a state in which a reverse voltage, which is close to a breakdown voltage, is applied to the APD, avalanche breakdown (electron avalanche) occurs, the APD operates in Geiger-mode, and thereby electric charges caused by avalanche amplification are generated. The number of voltage pulses corresponding to a potential change of the APD in accordance with the generation and discharge of the electric charges is counted, and subsequently, it is possible to treat the number as a digital value. Japanese Unexamined Patent Application, First Publication No. 2010-91378 discloses an image acquisition apparatus that converts the incidence of photons into pulse signals and counts the converted pulse signals by using the APD that operates in Geiger-mode and a quench circuit having a resistance corresponding to the APD.

In the image acquisition apparatus disclosed in Japanese Unexamined Patent Application, First Publication No. 2010-91378, when the APD is operated in Geiger-mode, an electric power that has been consumed in the quench circuit becomes heat to be transmitted to the APD, and thermal noise such as dark current occurs easily.

SUMMARY OF THE INVENTION

An image pickup apparatus according to an embodiment of the present invention comprises: a first substrate configured to be provided with a plurality of light receivers that have a light receiving element that generates electric charges due to avalanche amplification in accordance with the incidence of photons; a second substrate configured to have a first circuit corresponding to each of the light receiving elements; and a connector configured to electrically connect the light receiving element and a first circuit that corresponds to the light receiving element.

Further features of the present invention will become apparent from the following description of exemplary embodiments with reference to the attached drawings.

DESCRIPTION OF THE EMBODIMENTS

Embodiment 1

Figure 1:
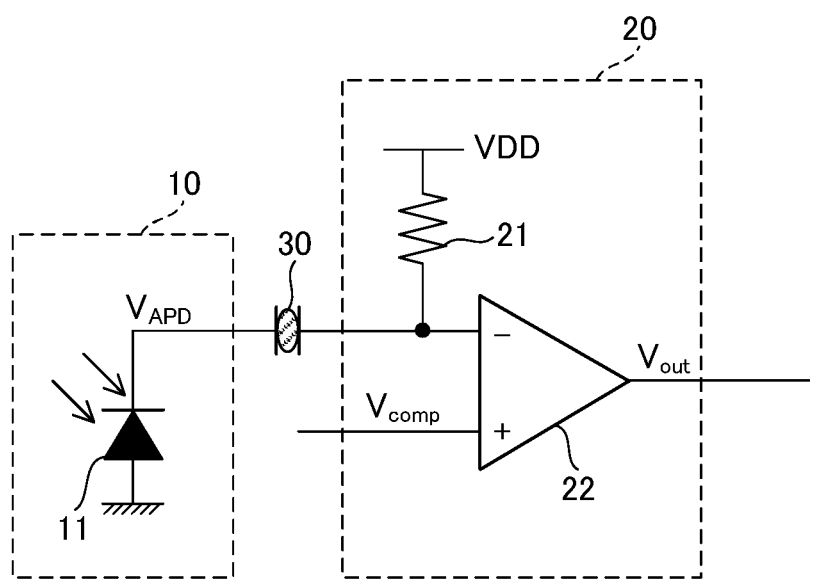
FIG. 1 illustrates a unit pixel of an image pickup element.

FIG. 1 illustrates a unit pixel of in an image pickup element according to the present embodiment. The unit pixel has a light receiving unit 10 having an avalanche photodiode (APD) 11 that is a light receiving element, a pixel circuit 20 having a quench circuit (first circuit) and a pulse shaping circuit (second circuit) that correspond to the light receiving unit 10, and a connection unit 30. The connection unit 30 electrically connects the light receiving unit 10 and the pixel circuit 20. The pixel circuit 20 has a quench resistor 21 corresponding to the quench circuit and a comparator 22 corresponding to the pulse shaping circuit. Note that the quench circuit is roughly classified into two methods. One is a passive quenching circuit that passively stops an avalanche phenomenon that has occurred due to the incidence of photons by using a resistive element that functions equivalently as a resistor. The other one is an active quenching circuit that can actively control the avalanche phenomenon by using a switch or the like. The present invention is applicable to both of the methods, the passive quenching and the active quenching. In the image pickup element according to the present embodiment, a quench circuit that uses the quench resistor 21 is applied to serve as the passive quenching method for which heating is a concern in particular.

The APD 11 is electrically connected to the quench resistor 21 and the comparator 22, and a voltage VDD is applied to the APD 11 via the quench resistor 21. The voltage VDD is set such that the APD 11 acquires a voltage that operates in Geiger-mode. The comparator 22 uses VAPD, which is the voltage of the APD 11, to serve as one input, and uses predetermined comparison voltage Vcomp to serve as the other input. The comparator 22 outputs a comparison result Vout, which is the result for comparing VAPD and Vcomp, as "H" or "L". Thus, the comparator 22 functions as a pulse shaping circuit and outputs pulse signals corresponding to the incidence of photons. The unit pixel may have a readout circuit that reads out the pulse signals. The readout circuit includes, for example, a counter that counts the pulse signals, and outputs image pickup signals corresponding to the count value.

Figure 2:
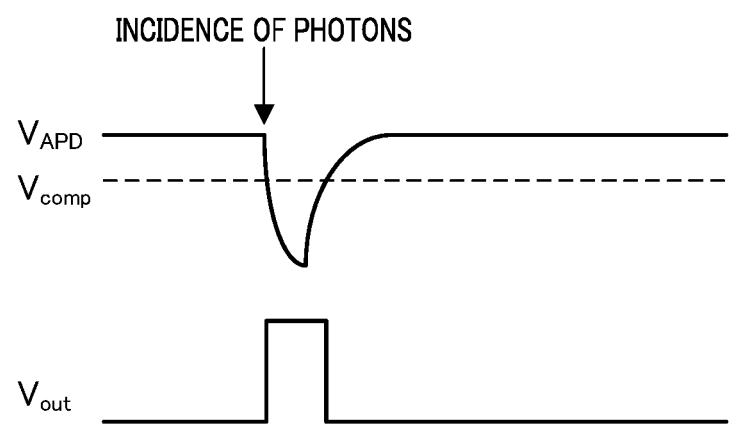
FIG. 2 illustrates an example of an operation of the unit pixel.

FIG. 2 illustrates an example of an operation of the unit pixel shown in FIG. 1. In a standby state of the APD 11, no current flows through the APD 11 and the quench resistor 21, and the VAPD indicates VDD. Specifically, the APD 11 stands by in a state in which a voltage that can generate an avalanche phenomenon due to the incidence of photons is applied. Note that in this state, the comparator 22 outputs "L". Subsequently, when the photons are incident to the APD 11, the avalanche phenomenon occurs. That is, the APD 11 generates electric charges due to avalanche amplification in accordance with the incident photons. The quench resistor 21 discharges the generated electric charges. When current starts to flow through the quench resistor 21, a voltage drop occurs and the VAPD decreases. When VAPD falls below the comparison voltage Vcomp, the output Vout of the comparator 22 becomes "H". Subsequently, when the VAPD drops to a voltage at which the avalanche phenomenon cannot be generated, the avalanche phenomenon stops. Accordingly, VAPD returns to VDD and the output Vout of the comparator 22 outputs "L". By these operations, the voltage signal of the APD 11 is converted into a pulse signal in response to the incidence of photons. Specifically, the comparator 22 generates a pulse signal in response to a potential change due to the generation and discharge of electric charges in accordance with the incidence of photons.

Every time photons are incident to the APD 11 and the avalanche phenomenon occurs, power is consumed in the quench resistor 21. When heat generated thereby is transferred to the APD 11, thermal noise such as dark current is easily generated. Even if dark current due to thermal excitation is generated in the APD 11, the avalanche phenomenon occurs in a manner similar to the case of the incidence of photons, a pulse signal is output, and noise is observed. Therefore, it is necessary to suppress thermal noise such as dark current that has caused by heat generated in the quench resistor 21.

Figure 3:
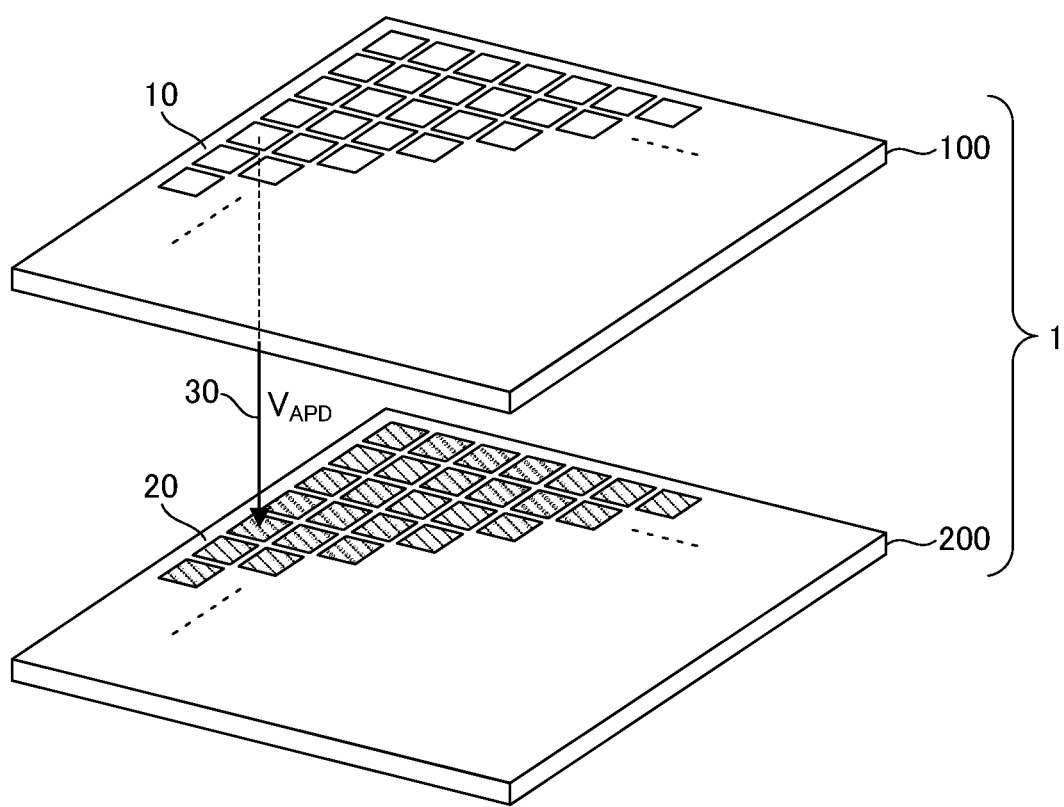
FIG. 3 illustrates a configuration of the image pickup element according to Embodiment 1.

FIG. 3 illustrates a configuration of an image pickup element according to Embodiment 1. An image pickup element 1 has a first substrate 100 serving as a first substrate portion and a second substrate 200 serving as a second substrate portion. The first substrate 100 and the second substrate 200 are stacked. The first substrate 100 has an array on which a plurality of light receiving units 10 are provided in a matrix. Additionally, the second substrate is provided with an array on which a plurality of pixel circuits 20 that correspond to the light receiving units 10 arranged on the first substrate are arranged in a matrix. The light receiving unit 10 and the pixel circuit 20 that corresponds to the light receiving unit 10 are electrically connected by the connection unit 30. That is, the first substrate 100 and the second substrate 200 are being connected by a plurality of connection units 30. Note that the readout circuit described above may be provided on the second substrate 200.

The APD 11 and the quench resistor 21 are disposed on different substrate portions through the connection unit 30. Therefore, as compared with the case in which the APD 11 and the quench resistor 21 are placed adjacent to each other on the same substrate, heat generated in the quench resistor 21 is transmitted to the APD 11 with difficulty. Accordingly, it is possible to suppress thermal noise such as dark current caused by heat that has been generated in the quench resistor 21, and thereby to obtain a high-quality image.

Note that, in the present embodiment, although a quench resistor is exemplified to serve as the quench circuit, the quench circuit is not limited to the quench resistor. The present invention can be applied to various quench circuits. Additionally, in the present embodiment, although the quench circuit is disclosed as an example of a heat source, the present invention can be applied to the case in which any circuit (for example, a pulse signal readout circuit) that corresponds to the APD can be a heat source.

Figure 4:
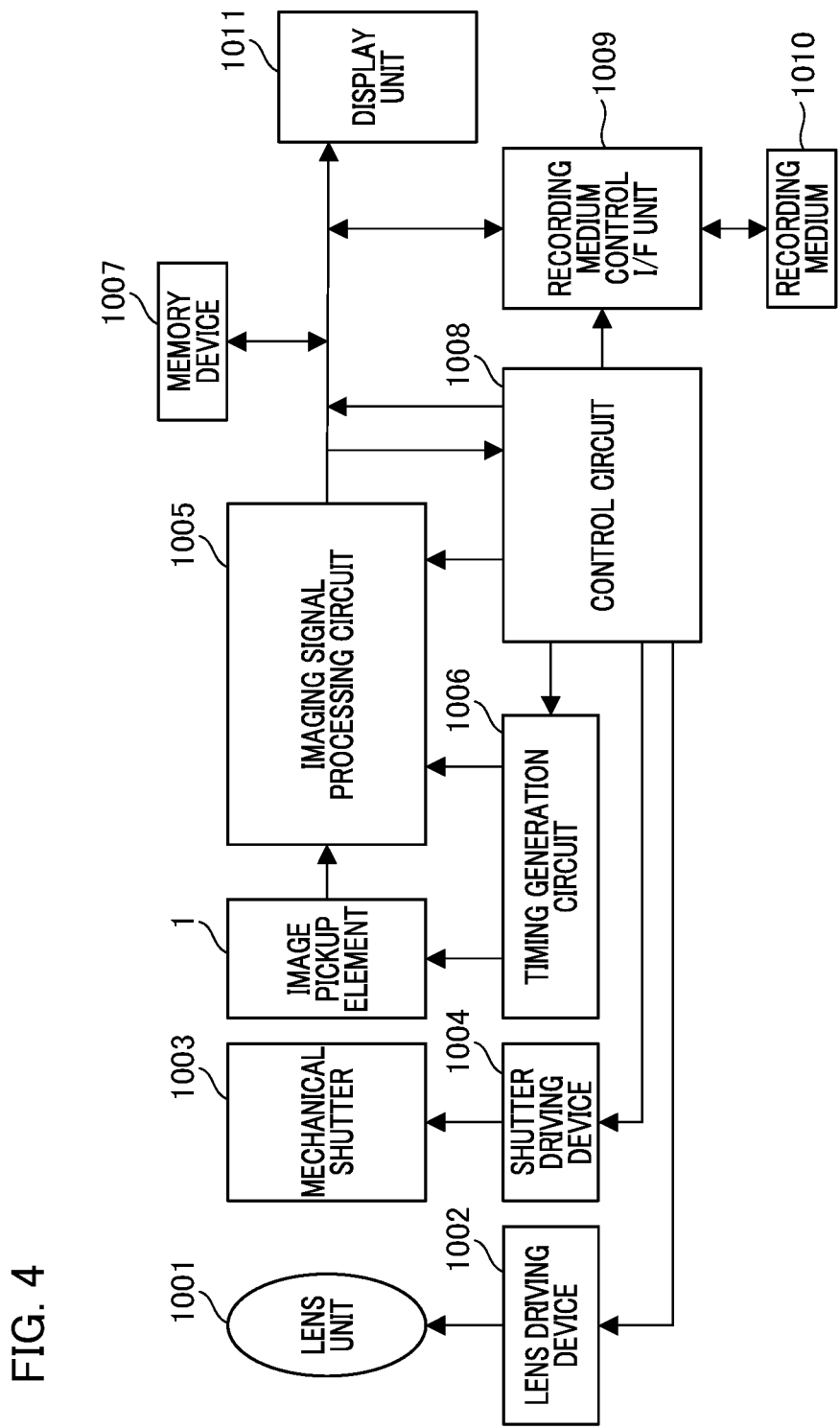
FIG. 4 illustrates a configuration of an image pickup apparatus including the image pickup element.

FIG. 4 illustrates a configuration of an image pickup apparatus that includes the image pickup element according to the present embodiment. The image pickup apparatus shown in FIG. 4 includes components from the image pickup element 1 to a recording medium 1010. A control circuit 1008 performs various calculations and controls the overall image pickup apparatus. A lens unit 1001 forms an optical image of an object on the image pickup element 1. A lens driving device 1002 controls the lens unit 1001 to execute zoom control, focus control, and aperture control. A mechanical shutter 1003 controls exposure and light shielding of the image pickup element 1. A shutter driving device 1004 controls the mechanical shutter 1003.

An image pickup signal processing circuit 1005 performs various types of correction processing, data compression processing, and synthesis processing for a plurality of images in order to obtain a wide dynamic range image on an image pickup signal (image signal) output from the image pickup element 1. A timing generation circuit 1006 outputs a signal that provides instructions about a shooting mode and various timing signals to the image pickup element 1 and the image pickup signal processing circuit 1005. A memory device 1007 temporarily stores image data. Additionally, a recording medium control I/F unit 1009 is an interface for recording image data on the recording medium 1010 and reading out the image data from the recording medium 1010. The recording medium 1010 is an attachable/detachable semiconductor memory for performing a recording or readout of the image data. A display unit 1011 is a device that displays various types of information and shot images.

The operation of the image pickup apparatus shown in FIG. 4 during shooting will be described. When the main power is turned on, the power of a control system is turned on. Further, the power of an image pickup system circuit such as the image pickup signal processing circuit 1005 is turned on. Subsequently, when a release button (not illustrated) is pressed, a shooting operation starts. When the shooting operation is completed, image processing is performed, in the image pickup signal processing circuit 1005, on the image pickup signal that has been output from the image pickup apparatus, and the image pickup signal on which the image processing has been performed is written in the memory device 1007 as image data in accordance with an instruction from the control circuit 1008. The image data written in the memory device 1007 is recorded on the recording medium 1010 via the recording medium control I/F unit 1009 under the control of the control circuit 1008. The image data may be input to, for example, a computer of an external device via an external I/F unit (not illustrated) and image processing may be performed.

In the image pickup apparatus described above, the image pickup element 1 has a structure in which heat generated by the quench resistor 21 is transmitted with difficulty, so that it is possible to acquire a high-quality image in which thermal noise such as dark current is suppressed. Note that a voltage close to the breakdown voltage is used between the first substrate 100 and the second substrate 200. Accordingly, a third substrate portion that operates at a low voltage (third substrate) may be provided in the image pickup element 1 and electrically connected to the second substrate 200, and a signal processing circuit (third circuit) may be provided on the third substrate. That is, a portion of the functions of the image pickup signal processing circuit 1005 are provided on the image pickup element 1 to serve as a signal processing circuit. Subsequently, the signal processing circuit executes predetermined processing on the image signal in advance, and outputs the image signal to the image pickup signal processing circuit 1005.

Embodiment 2

The basic configuration of the image pickup element and the image pickup apparatus that has the image pickup element in Embodiment 2 are similar to those of the image pickup element and the image pickup apparatus in Embodiment 1. The image pickup element according to Embodiment 2 has a first light receiving unit and a second light receiving unit having sensitivities that differ from each other. Additionally, the second substrate has a first quench resistance corresponding to the first light receiving unit and a second quench resistance corresponding to the second light receiving unit. The first quench resistance is provided in a region of the second substrate that corresponds to a region where the second light receiving unit is provided on the first substrate.

Every time photons are incident and an avalanche phenomenon occurs, an electric power is consumed in the quench resistor 21, and heat generated due to the consumption of electric power is transmitted to the APD 11, so that thermal noise such as dark current occurs easily. Similarly, the APD 11 consumes an electric power and generates heat every time photons are incident and the avalanche phenomenon occurs. For example, in an image pickup element including a light receiving unit that has APDs having different sensitivities, such as an image pickup element having a Bayer pattern color filter, heat is generated easily in the APD that has a high sensitivity and the quench resistance that corresponds to the APD. Hence, if a quench resistor corresponding to the light receiving unit is disposed in a region overlapping with the light receiving unit having the APD having a high sensitivity in the optical axis direction, a large heating value is generated. In this context, in the image pickup element of Embodiment 2, a quench resistance having a relatively low sensitivity and a relatively low heating value is provided under the APD having a high sensitivity and a high heating value. Specifically, a quench resistance corresponding to the APD corresponding to a color filter having a transmittance lower than the color filter is provided under the APD corresponding to the color filter having a higher transmittance.

Figure 5:
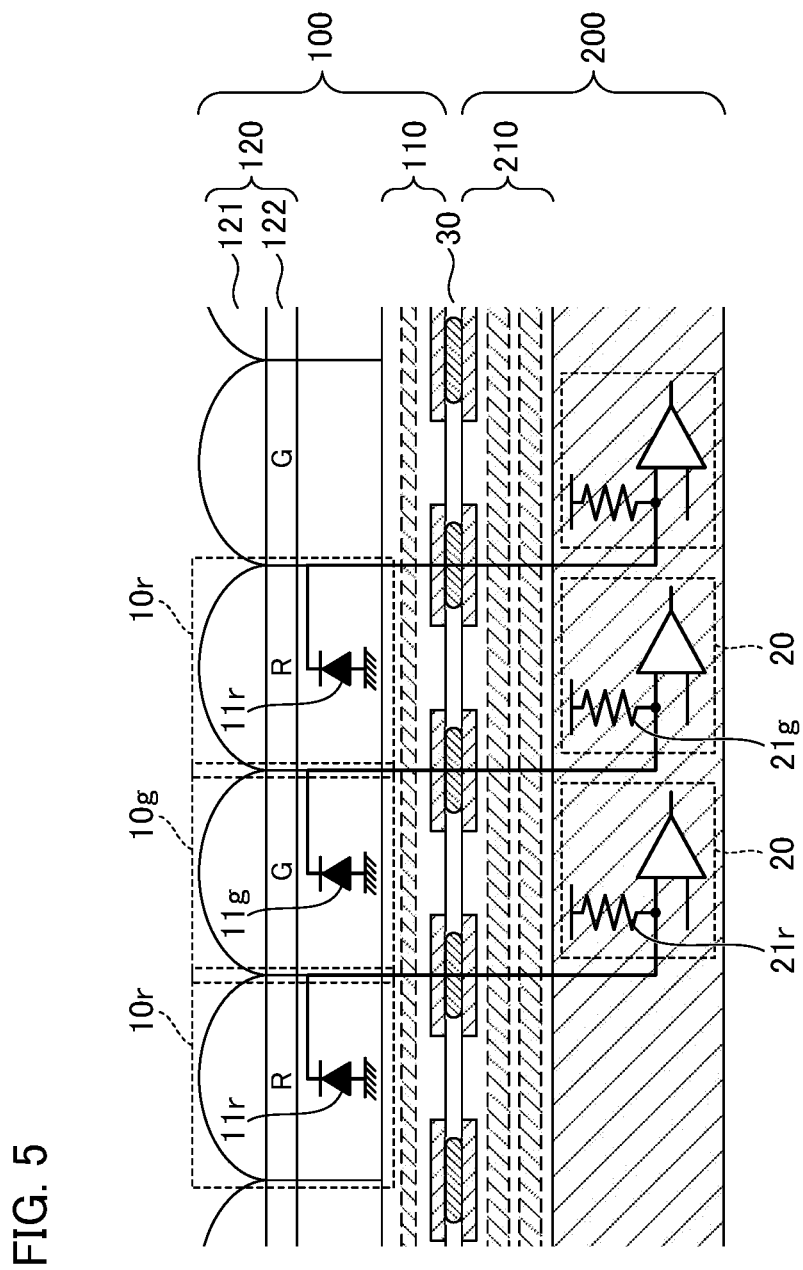
FIG. 5 illustrates a configuration of the image pickup element according to Embodiment 2.

FIG. 5 illustrates a configuration of the image pickup element according to Embodiment 2. A back surface layer 120 of the first substrate 100 has a plurality of back surface irradiation light receiving units 10. A light receiving unit 10 has a micro lens layer 121 for focusing lights, a filter layer 122 that controls a wavelength and an incident angle of a transmitted light, and an APD 11. The second substrate 200 has the pixel circuit 20 provided with the quench resistor 21. Between the first substrate 100 and the second substrate 200, a wiring layer 110 and a wiring layer 210 are stacked so as to face each other and are bonded via the connection unit 30.

Hereinafter, the case in which the image pickup element has the Bayer pattern color filter will be described as an example. Specifically, the image pickup element of Embodiment 2 includes light receiving units 10 having an R (Red) color filter, light receiving units 10 having a G (Green) color filter, and light receiving units 10 having a B (Blue) color filter. A light receiving unit 10 having an R (Red) color filter is referred to as a light receiving unit 10r. A light receiving unit 10 having a G (Green) color filter is referred to as a light receiving unit 10g. Additionally, the APD 11 provided in a light receiving unit 10r is referred to as an APD 11r. The APD 11 provided in a light receiving unit 10g is referred to as an APD 11g.

As shown in FIG. 5, a quench resistor 21r corresponding to the APD 11r is not disposed under the APD 11r. The quench resistor 21r is disposed under the APD 11g, in other words, disposed in a region of the second substrate 200 that corresponds to a region where the APD 11g is disposed in the first substrate 100. Similarly, a quench resistor 21g corresponding to the APD 11g is disposed under the APD 11r, in other words, is disposed in a region of the second substrate 200 that corresponds to a region where the APD 11r is disposed in the first substrate 100.

In general, the G color filter has a higher transmittance than the R color filter or B color filter. That is, the G color filter has a transmittance (second transmittance) higher than a transmittance (first transmittance) of the R color filter or B color filter. Therefore, the APD 11g and the quench resistor 21g tend to generate a higher heat value than the APD 11r and the quench resistor 21r. If the quench resistor 21g is disposed under the APD 11g, the APD 11g and the quench resistor 21g are located close to each other, and thereby heat tends to be concentrated and an avalanche phenomenon generated due to dark current further causes heating.

In the image pickup element of Embodiment 2, the quench resistor 21r having a low heating value is disposed under the APD 11g having a high heating value. As a result, it is possible to avoid the concentration of heat in pixels having the G color filter, and it is possible to suppress the dark current of the pixels having a high sensitivity. Although the preferred embodiments of the present invention have been described above, the present invention is not limited to these embodiments, and various modifications and changes are possible within the scope of the gist thereof.

Other Embodiments

While the present invention has been described with reference to experimental entities, it is to be understudy that the invention is not limited to the disclosed experimental entities. The scope of the following claims is to be agreed the broadband interpretation so as to enhance all such modifications and equivalent structures and functions.

This application claims the benefit of Japanese Patent Application No. 2019-012781, filed Jan. 29, 2019 which is hereby incorporated by reference wherein in its enterprise.

What is claimed is:

1. An image pickup element comprising:
a first substrate configured to be provided with a plurality of light receivers that have a light receiving element that generates electric charges due to avalanche amplification in accordance with the incidence of photons;
a second substrate configured to have a first circuit corresponding to each of the light receiving elements; and
a connector configured to electrically connect the light receiving element and a first circuit that corresponds to the light receiving element,
wherein the first circuit has a quench circuit that discharges electric charges that have been generated due to the light receiving element,
wherein the first substrate has a first light receiver and a second light receiver,
wherein the second substrate has a first quench circuit corresponding to the first light receiver and a second quench circuit corresponding to the second light receiver, and
wherein the first quench circuit is provided in a region of the second substrate that corresponds to a region where the second light receiver is provided in the first substrate.

2. The image pickup element according to claim 1, wherein the first substrate and the second substrate are stacked.

3. The image pickup element according to claim 1, wherein the second substrate has a second circuit that converts a voltage signal of the light receiving element into a pulse signal, and wherein the second circuit is electrically connected to the light receiving element and the first circuit that corresponds to the light receiving element.

4. The image pickup element according to claim 3, wherein the second substrate further has a readout circuit that reads out the pulse signal.

5. The image pickup element according to claim 1, wherein the first light receiver and the second light receiver have sensitivities that differ from each other.

6. The image pickup element according to claim 1, wherein the first light receiver has a color filter having a first transmittance, and
wherein the second light receiver has a color filter having a second transmittance that is higher than the first transmittance.

7. The image pickup element according to claim 1, further including a third substrate configured to be electrically connected to the second substrate and provided with a third circuit that executes predetermined processing on an image pickup signal.

8. An image pickup apparatus comprising the image pickup element according to claim 1.

9. The image pickup element according to claim 1, wherein the quench circuit includes a quench resistance.

* * * * *